(12) United States Patent
Agarwal et al.

(10) Patent No.: US 12,226,795 B2
(45) Date of Patent: Feb. 18, 2025

(54) DISPENSE VOLUME ADJUSTMENT BASED ON GAP WIDTH OF LOCATED FEATURES

(71) Applicant: Illinois Tool Works Inc., Glenview, IL (US)

(72) Inventors: Sunny Agarwal, Franklin, MA (US); Ronald J. Forget, Douglas, MA (US)

(73) Assignee: Illinois Tool Works Inc., Glenview, IL (US)

( * ) Notice: Subject to any disclaimer, the term of this patent is extended or adjusted under 35 U.S.C. 154(b) by 63 days.

(21) Appl. No.: 18/134,648

(22) Filed: Apr. 14, 2023

(65) Prior Publication Data
US 2024/0342746 A1   Oct. 17, 2024

(51) Int. Cl.
*B05C 11/10*   (2006.01)
*H05K 3/00*    (2006.01)

(52) U.S. Cl.
CPC ...... *B05C 11/1021* (2013.01); *B05C 11/1034* (2013.01); *H05K 3/0091* (2013.01)

(58) Field of Classification Search
CPC .................................................. B05C 11/1021
See application file for complete search history.

(56) References Cited

U.S. PATENT DOCUMENTS

| | | |
|---|---|---|
| 2014/0060144 A1 | 3/2014 | Bloom et al. |
| 2014/0093638 A1 | 4/2014 | Bloom et al. |
| 2014/0094963 A1* | 4/2014 | Bloom ............ G06T 7/0008 700/231 |
| 2019/0191597 A1 | 6/2019 | Han et al. |

OTHER PUBLICATIONS

International Search Report for PCT Application No. PCT/US2024/018476 mailed on Jun. 10, 2024.

* cited by examiner

*Primary Examiner* — Tabatha L Penny
(74) *Attorney, Agent, or Firm* — Lando & Anastasi, LLP

(57) ABSTRACT

A method of depositing material on an electronic substrate with a dispensing system includes acquiring an image of a first feature of a first component and an adjacent second feature of a second component, performing a measure command to measure an actual distance of a gap between the first feature of the first component and the second feature of the second component, dividing the length of the gap into segments to determine a gap width for each segment, based on the gap width, determining a number of dots to be dispensed by the dispensing unit for each segment, and performing the dispense operation for each segment.

7 Claims, 3 Drawing Sheets

DISPENSE VOLUME ADJUSTMENT BASED ON GAP WIDTH OF LOCATED FEATURES

BACKGROUND OF THE DISCLOSURE

1. Field of the Disclosure

This disclosure relates generally to apparatus and methods for dispensing a viscous material on an electronic substrate, such as a printed circuit board, and more particularly to an apparatus and a method for dispensing material on an electronic substrate with a dispensing unit configured to adjust a volume of dispensed material based on a located feature.

2. Discussion of Related Art

There are several types of dispensing systems used to dispense precise amounts of liquid or paste for a variety of applications. One such application is the assembly of integrated circuit chips and other electronic components onto circuit board substrates. In this application, automated dispensing systems are used for dispensing dots of liquid epoxy or solder paste, or some other related material, onto printed circuit boards. Automated dispensing systems are also used for dispensing lines of underfill materials and encapsulants, which may be used to mechanically secure components to the printed circuit board. Exemplary dispensing systems described above include those manufactured and distributed by Illinois Tool Works Electronic Assembly Equipment (ITW EAE), with offices at Hopkinton, Massachusetts.

In a typical dispensing system, a dispensing unit is mounted to a moving assembly or gantry for moving the dispensing unit along three mutually orthogonal axes (x-axis, y-axis, and z-axis) using servomotors controlled by a computer system or controller. To dispense a dot of liquid on a printed circuit board or other substrate at a desired location, the dispensing unit is moved along the co-planar horizontal x-axis and y-axis directions until the dispensing unit is located over the desired location. The dispensing unit is then lowered along the perpendicularly oriented vertical z-axis direction until a nozzle/needle of the dispensing unit and dispensing system is at an appropriate dispensing height over the electronic substrate. The dispensing unit dispenses a dot of liquid, is then raised along the z-axis, moved along the x- and y-axes to a new location, and is lowered along the z-axis to dispense the next liquid dot. For applications such as encapsulation or dispensing of underfill as described above, the dispensing unit is typically controlled to dispense lines of material as the dispensing unit is moved in the x- and y-axes along the desired path of the lines. For some types of dispensing units, such as jetting pumps, the z-axis movement prior to and subsequent to a dispense operation may not be required.

Vision systems are used to locate objects on the electronic substrate. Determining an amount of volume of material to dispense can be difficult. For gaps having varying widths and for small gaps, it is difficult to control the amount of volume of material and to dispense material underneath a component on a substrate.

SUMMARY OF THE DISCLOSURE

One aspect of the present disclosure is directed to a method of depositing material on an electronic substrate with a dispensing system of the type including a frame, a dispensing unit gantry movably coupled to the frame, a dispensing unit coupled to the dispensing unit gantry, the dispensing unit being configured to deposit material onto the electronic substrate during a dispense operation, a vision system gantry coupled to the frame, and a vision system coupled to the vision system gantry. The vision system is configured to obtain one or more images of the electronic substrate having two adjacent features prior to performing the dispense operation. In one embodiment, the method comprises: acquiring an image of a first feature of a first component and an adjacent second feature of a second component; performing a measure command to measure an actual distance of a gap between the first feature of the first component and the second feature of the second component; dividing the length of the gap into segments to determine a gap width for each segment; based on the gap width, determining a number of dots to be dispensed by the dispensing unit for each segment; and performing the dispense operation for each segment.

Embodiments of the method further may include determining the number of dots by a table having dots to be dispensed based on gap width. Performing the dispense operation may include includes controlling a speed of the gantry to dispense a desired number of dots within a respective segment. Performing the dispense operation further may include controlling a rate of dots dispensed by the dispensing unit to be a substantially consistent rate along the length of the gap. Performing the dispense operation may include controlling a rate of dots dispensed by the dispensing unit to dispense a desired number of dots within a respective segment. Performing the dispense operation further may include controlling a speed of the gantry to be a substantially consistent speed along the length of the gap. Each image may be composed of pixels with each pixel being the smallest picture element the vision system can uniquely identify and interpreted as Black or White with shades of gray. The method further may include determining whether the actual gap is less than a predetermine minimum limit, and if less than the predetermined minimum limit, performing no action.

A computer-readable medium comprising instructions which, when executed by a computer, cause the computer to carry out the method of: acquiring an image of a first feature of a first component and an adjacent second feature of a second component; performing a measure command to measure an actual distance of a gap between the first feature of the first component and the second feature of the second component; dividing the length of the gap into segments to determine a gap width for each segment; based on the gap width, determining a number of dots to be dispensed by the dispensing unit for each segment; and performing the dispense operation for each segment.

Embodiments of the computer-readable medium further may include determining the number of dots by a table having dots to be dispensed based on gap width. Performing the dispense operation may include controlling a speed of the gantry to dispense a desired number of dots within a respective segment. Performing the dispense operation further may include controlling a rate of dots dispensed by the dispensing unit to be a substantially consistent rate along the length of the gap. Performing the dispense operation may include controlling a rate of dots dispensed by the dispensing unit to dispense a desired number of dots within a respective segment. Performing the dispense operation further may include controlling a speed of the gantry to be a substantially consistent speed along the length of the gap. Each image may be composed of pixels with each pixel being the smallest picture element the vision system can uniquely identify and interpreted as Black or White with shades of gray. The computer-readable medium further may include determining whether the actual gap width is less than a predetermine minimum limit, and if less than the predetermined minimum limit, performing no action;

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION OF THE DISCLOSURE

Figure 1:
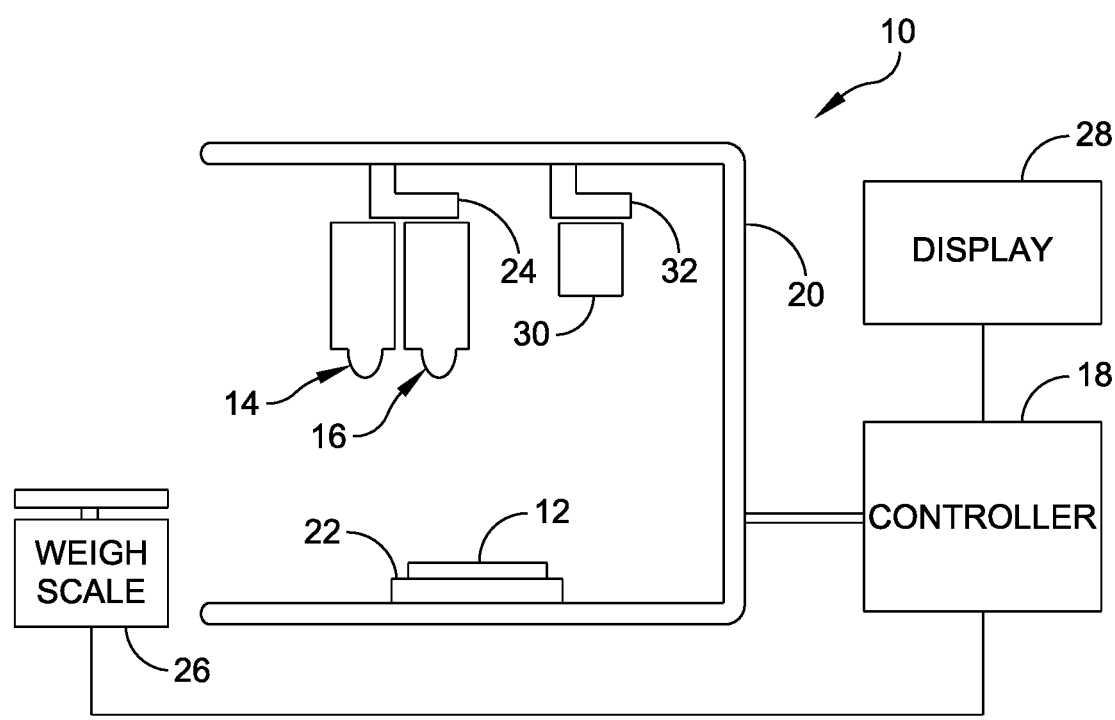
FIG. 1 is a schematic view of a dispensing system.

Various embodiments of the present disclosure are directed to viscous material dispensing systems, devices including dispensing systems. Embodiments disclosed herein are directed to techniques for dispensing material on an electronic substrate by a dispensing system. Such dispensing systems are configured to dispense an assembly material (e.g., solder paste, conductive ink, adhesive, or encapsulation material) onto an electronic substrate (e.g., a printed circuit board, referred to herein as an "electronic substrate," a "circuit board," a "board," a "PCB," a "PCB substrate," a "substrate," or a "PCB board") or to perform other operations. Specifically, embodiments of the present disclosure are described below with reference to dispensing system, sometimes referred to as "dispensers," used to produce printed circuit boards.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

FIG. 1 schematically illustrates a dispensing system, generally indicated at 10, according to one embodiment of the present disclosure. The dispensing system 10 is used to dispense a viscous material (e.g., an adhesive, encapsulant, epoxy, solder paste, underfill material, etc.) or a semi-viscous material (e.g., soldering flux, etc.) onto an electronic substrate 12, such as a printed circuit board or semiconductor wafer. The dispensing system 10 may alternatively be used in other applications, such as for applying automotive gasketing material or in certain medical applications or for applying conductive inks. It should be understood that references to viscous or semi-viscous materials, as used herein, are exemplary and intended to be non-limiting. In one embodiment, the dispensing system 10 includes first and second dispensing units, generally indicated at 14 and 16, respectively, and a controller 18 to control the operation of the dispensing system. It should be understood that dispensing units also may be referred to herein as dispensing pumps and/or dispensing heads. Although two dispensing units are shown, it should be understood that a single dispensing unit or multiple dispensing units can be employed.

The dispensing system 10 may also include a frame 20 having a base or support 22 for supporting the electronic substrate 12, a dispensing unit gantry 24 movably coupled to the frame 20 for supporting and moving the dispensing units 14, 16, and a weight measurement device or weigh scale 26 for weighing dispensed quantities of the viscous material, for example, as part of a calibration procedure, and providing weight data to the controller 18. A conveyor system (not shown) or other transfer mechanism, such as a walking beam, may be used in the dispensing system 10 to control loading and unloading of electronic substrates to and from the dispensing system. The gantry 24 can be moved using motors under the control of the controller 18 to position the dispensing units 14, 16 at predetermined locations over the electronic substrate. The dispensing system 10 may include a display unit 28 connected to the controller 18 for displaying various information to an operator. There may be an optional second controller for controlling the dispensing units. Also, each dispensing unit 14, 16 can be configured with a z-axis sensor, e.g., a laser, to detect a height at which the dispensing unit is disposed above the electronic substrate 12 or above a feature mounted on the electronic substrate. The z-axis sensor is coupled to the controller 18 to relay information obtained by the sensor to the controller.

Prior to performing a dispensing operation, as described above, the electronic substrate, e.g., the printed circuit board, must be aligned or otherwise in registration with a dispensing unit of the dispensing system. The dispensing system further includes a vision system 30, which, in one embodiment, is coupled to a vision system gantry 32 movably coupled to the frame 20 for supporting and moving the vision system. In another embodiment, the vision system 30 may be provided on the gantry 24. As described, the vision system 30 is employed to verify the location of landmarks, known as fiducials, targets or reference points, on the electronic substrate. Once located, the controller can be programmed to manipulate the movement of one or more of the dispensing units 14, 16 to dispense material on the electronic substrate.

Systems and methods of the present disclosure are directed to dispensing material onto an electronic substrate, e.g., a printed circuit board. The description of the systems and methods provided herein reference exemplary electronic substrates 12 (e.g., printed circuit boards), which are supported on the support 22 of the dispensing system 10. In one embodiment, the dispense operation is controlled by the controller 18, which may include a computer system configured to control material dispensing units. In another embodiment, the controller 18 may be manipulated by an operator. The controller 18 is configured to manipulate the movement of the vision system gantry 32 to move the vision system so as to obtain one or more images of the electronic substrate 12. The controller 18 further is configured to manipulate the movement of the gantry 24 to move the dispensing units 14, 16 to perform dispensing operations.

The methods disclosed herein further support the use of various types of dispensing units, including, but not limited to, auger, piston, time and pressure, and jetting pumps.

In one embodiment, an exemplary dispensing system described herein may embody Camalot® dispensing systems, such as PRODIGY™ dispensers, sold by ITW EAE of Hopkinton, Massachusetts.

One particular challenge is to dispense an appropriate amount of material in a gap between two features. Embodiments of a method disclosure herein are directed to adjusting a dispense volume based on the positions of the located features. The width of a gap between two features may vary along a length of the gap. In one embodiment, a vision system, such as vision system 30, can be employed by the vision system gantry 32 to locate an edge of a component. Next, the method includes providing a measure command to measure an actual gap between an outer edge of a first feature and an inner edge of the second feature. A minimum limit on a gap between the inner and outer edges is determined. If the gap is less than the minimum limit, no dispense operation is performed. If the gap is greater than or equal to the minimum limit, the length of the gap is divided into segments and a gap width is determined for each segment. Based on the viscosity of the material and other external factors, a table is provided for each line to define a line width based on the gap measurement. The line width controls a speed of the gantry, such as gantry 24, which in turn controls amount of material dispensed within a particular segment. The line width may be defined as a number of dots that are dispensed per a predefined length, e.g., millimeter (mm). The greater the line width, the slower the gantry speed. The speed at which the dots are dispensed may be defined as the number of dispensed dots per second (Hz). A single line command can be provided for all of the segments or separate line commands can be provided for each segment.

Figure 2:
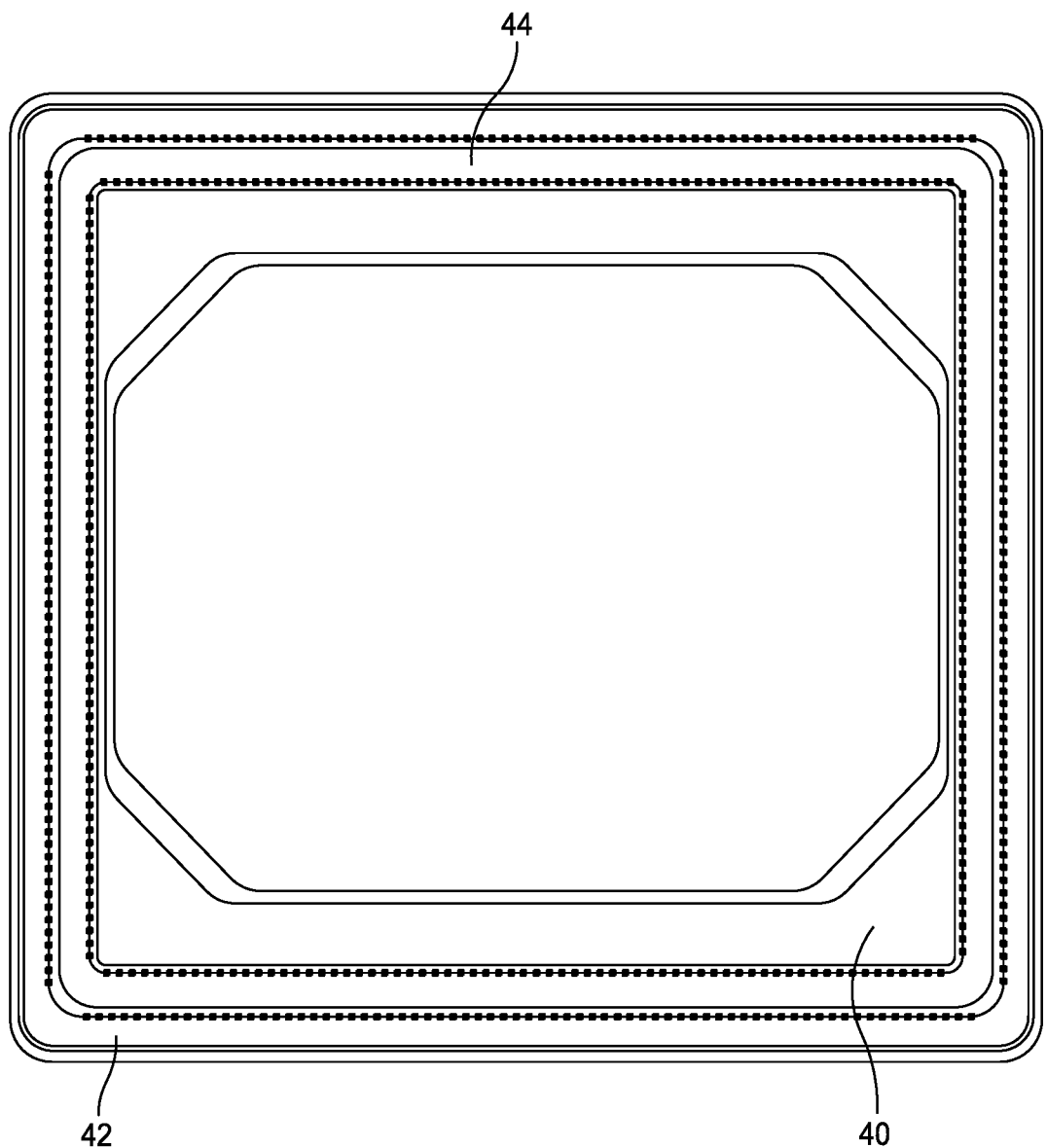
FIG. 2 is a plan view of a component on an electronic substrate.

In one example, with reference to FIG. 2, an image of a component 40, e.g., any type of component mounted on the electronic substrate, is taken by a vision system, such as vision system 30. Specifically, in one example employing the dispensing system 10 of FIG. 1, the vision system gantry 32, under the control of the controller 18, moves the vision system 30 over the component 40 to obtain the image of the component. FIG. 2 illustrates an image of the whole or complete component 40. However, an image of a portion of the component 40 may also be provided. As shown, the component 40 is supported within a chassis 42. A gap 44 is provided between outer edges of the component 40 and inner edges of the chassis 42. The gap 44 varies along the four sides of the component 40 and the chassis 42. Further, the gap 44 varies along a length of each side, meaning that the gap 44 is wider or narrower along a length of each side.

Based on image of the component, the controller, such as controller 18, can be configured to program a measure command for each side to measure an actual distance between the outer edge of the component 40 and the inner edge of the chassis 42. Edges on the component 40 and the chassis 42 can be beveled, radial or sharp, depending on the product design and how the edges are displayed by the vision system and the vision system software. The controller can be configured to set a minimum limit on a gap between the outer edge of the component 40 and the inner edge of the chassis 42. In one embodiment, the gap 44 can be set to a predetermined minimum limit by the user, and if the gap is less than the minimum limit, the controller can be configured to skip performing a dispense operation on the whole part if any edge section is found lower than the minimum limit. With a small gap, e.g., less than 0.45 mm, a dispense operation may be omitted on the whole or in part if any edge section gap distance is found to be lower than the defined minimum limit. However, if the programmed measure command determines the measured gap 44 to be greater than or equal to the minimum limit, e.g., greater or equal to than 0.45 mm, the controller can be configured to perform a dispense operation.

Figure 3:
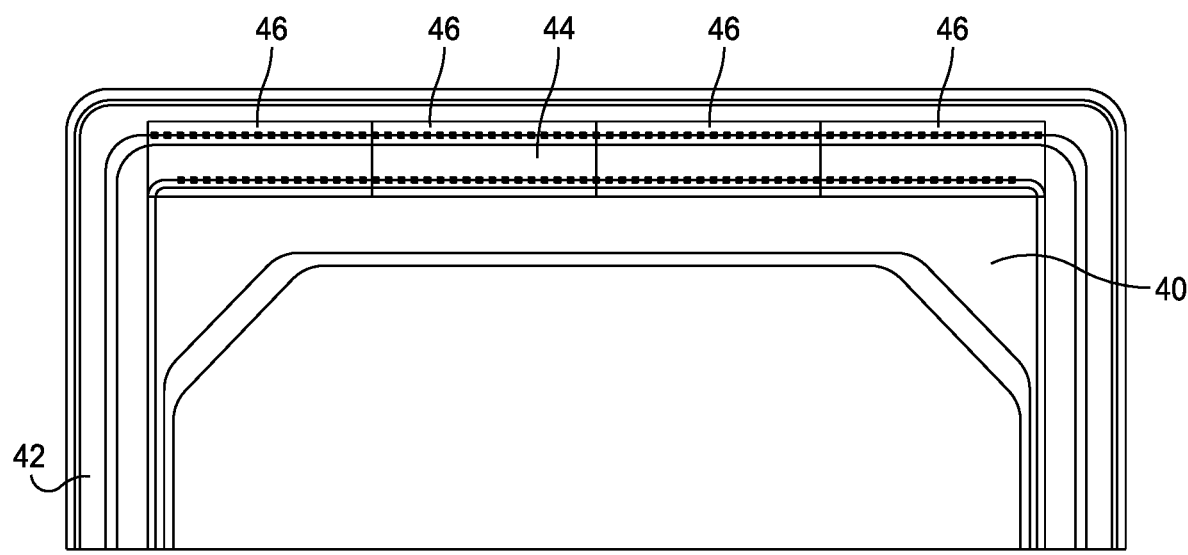
FIG. 3 is an enlarged plan view of a portion of the component showing a gap divided by a number of segment lines.

Referring to FIG. 3, to perform the measure command, the controller is configured to divide each side of the gap 44 between the component 40 and the chassis 42 into a number of segments, each indicated at 46. In some embodiments, the number of segments 46 can be three to twenty segments. The measure command includes determining a gap width for each segment 46. Based on found gap width, a line width is drawn from the preprogrammed template as shown below.

In one embodiment, a table may be provided for each line to define the line width based on the gap measurement obtained for each segment 46. Reference can be provided below to Table 1. The determination of the line width controls a speed of the gantry to control the amount of material dispensed by the dispensing unit, e.g., dispensing unit 14 or 16. The line width is defined as a number of dots dispensed per unit length, such as dots/mm. For example, if a line is 10 mm long and a line width is 3 dots/mm, a total dispense of 30 dots to be dispensed at calculated spacing between individual dots determined by the velocity of the gantry carrying the dispensing unit.

TABLE 1

| Gap Measurement, mm | | |
| --- | --- | --- |
| Low | High | Line Width, Number of Dots/mm |
| 0.45 | 0.50 | 2 |
| 0.50 | 0.55 | 3 |
| 0.55 | 0.60 | 4 |
| 0.60 | 0.65 | 5 |

Figure 4:
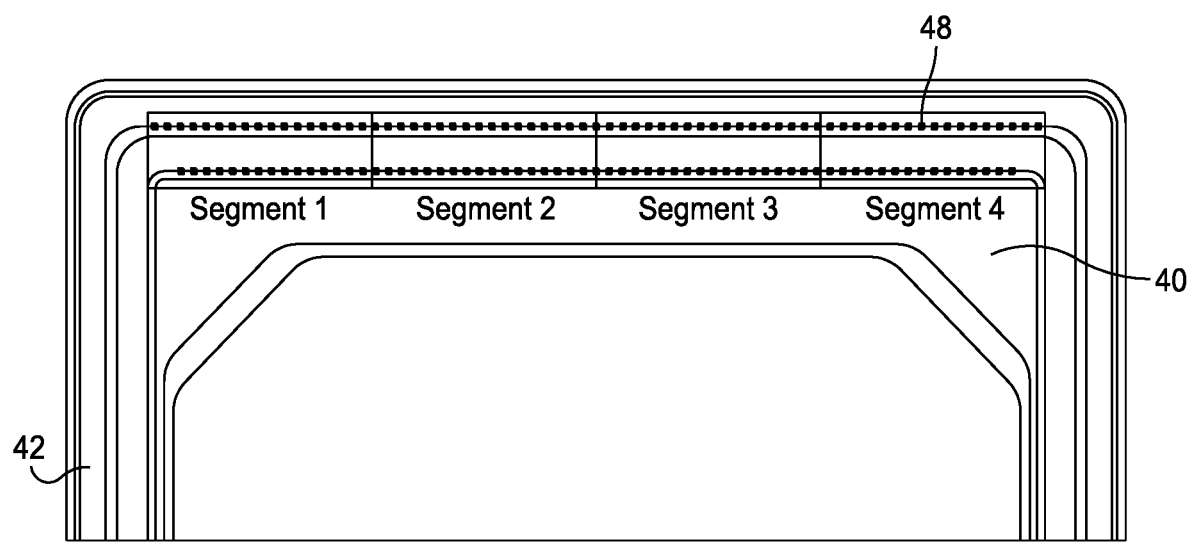
FIG. 4 is an enlarged plan view of the portion of the component showing four segments.

Referring to FIG. 4, in one example, an elongate gap or line 48 having a predefined length is divided into a number of segments based on a length of the line. In the shown example, the line 48 is divided into four segments. As shown below in Table 2, a first segment (Segment No. 1) has a measured gap of 0.46 mm, which is greater than a minimum gap width of 0.45 mm, and a line width of 2 dots. A second segment (Segment No. 2) has a measured gap of 0.54 mm and a line width of 3 dots. A third segment (Segment No. 3) has a measured gap of 0.59 mm and a line width of 4 dots. And finally, a fourth line segment (Segment No. 4) has a measured gap of 0.65 and a line width of 5 dots.

TABLE 2

| Segment Number | Measured Gap, mm | Within Gap Limit | Line Width | RPM, Hz |
|---|---|---|---|---|
| 1 | 0.46 | Yes | 2 | 100 |
| 2 | 0.54 | Yes | 3 | 100 |
| 3 | 0.59 | Yes | 4 | 100 |
| 4 | 0.65 | Yes | 5 | 100 |

As shown with the example provided above, the width of line 48 becomes increasingly wider from left to right in FIG. 4. However, aspects of the method disclosed herein can be configured to address line lengths with varying measured gap widths along the length of the line across each defined segment. The controller, e.g., controller 18, can be configured to control the dispensing unit, e.g., dispensing units 14, 16 and the dispensing unit gantry, e.g., gantry 24, to dispense a line of material through each segment, e.g., Segment Nos. 1-4, of the line 48.

In the shown embodiment, during a dispense operation, as the width of the line 48 increases, the gantry, e.g., gantry 24, is configured by the controller to move at a slower speed, while the dispensing unit, e.g., dispensing unit 14 or 16, dispenses at a continuous rate. The greater the line width, the slower the gantry speed, and conversely, the smaller the line width, the greater the gantry speed. The rate of speed of movement of the gantry depends on the amount of material being dispensed. Other factors may be considered. As used herein, revolutions per minute (RPM) or Hz may be used to define the number of dispensed dots per second. As shown in the table above, a single command can be provided to perform a dispense operation on all four segments or individual command can be provided for each segment. The latter would result in each segment having a different RPM and thus a different speed of movement.

Thus, for the example shown in FIG. 4 and Table 2, the gantry is configured to move the dispensing unit at a relatively higher rate of speed to dispense two dots in the first segment (Segment No. 1), at a relatively slower rate of speed to dispense three dots in the second segment (Segment No. 2), at a further relatively slower rate of speed to dispense four dots in the third segment (Segment No. 3), and at an even further relatively slower rate of speed to dispense five dots in the fourth segment (Segment No. 4). The rate at which the dispensing unit dispenses dots of material is 100 Hz, so the speed of movement of the gantry is adjusted accordingly.

In other embodiments, the rate at which dots is dispensed by the dispensing unit can be varied to address segments having varying gap widths. As referenced above, in one embodiment, the volume of material dispensed is controlled by varying the speed of the gantry having the dispensing unit, e.g., dispensing unit 14 or 16. However, in another embodiment, the rate in which the dispensing unit dispenses dots can be modified depending on the measured gap within the segment to vary the number of dots dispensed in that segment. This is achieved while maintaining a constant speed of the dispensing unit on the gantry. Thus, in this embodiment, the rate at which material is dispensed by the dispensing unit is at a relatively slow rate to dispense two dots in the first segment, at a relatively higher rate to dispense three dots in the second segment, at a further relatively higher rate to dispense four dots in the third segment, and at an even further relatively higher rate to dispense five dots in the fourth segment.

In some embodiments, a line to be dispensed is divided into four or five segments, with each segment being between 4 and 5 mm in length. A gap width is measured for each segment. Based on the measured gap width, a number of dots is selected to be dispensed for each gap.

In some embodiments, each image is composed of pixels with each pixel being the smallest picture element the vision system can uniquely identify and interpreted as Black or White with shades of gray.

Various controllers, such as the controller 18, may execute various operations discussed above. Using data stored in associated memory and/or storage, the controller 18 also executes one or more instructions stored on one or more non-transitory computer-readable media, which the controller 18 may include and/or be coupled to, that may result in manipulated data. In some examples, the controller 18 may include one or more processors or other types of controllers. In one example, the controller 18 is or includes at least one processor. In another example, the controller 18 performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of depositing material on an electronic substrate with a dispensing system including a frame, a dispensing unit gantry movably coupled to the frame, a dispensing unit coupled to the dispensing unit gantry, the dispensing unit being configured to deposit material onto the electronic substrate during a dispense operation, a vision system gantry coupled to the frame, and a vision system coupled to the vision system gantry, the vision system being configured to obtain one or more images of the electronic substrate having two adjacent features prior to performing the dispense operation, the method comprising:
   acquiring an image of a first feature of a first component and an adjacent second feature of a second component;
   performing a measure command to measure a length of a gap between the first feature of the first component and the second feature of the second component;
   dividing the length of the gap into segments;
   determining a gap width for each segment;
   based on the gap width, determining a number of dots to be dispensed by the dispensing unit for each segment; and
   performing the dispense operation for each segment.

2. The method of claim 1, wherein determining the number of dots is defined by a table having dots to be dispensed based on gap width.

3. The method of claim 1, wherein performing the dispense operation includes controlling a speed of the dispensing unit gantry to dispense a desired number of dots within a respective segment.

4. The method of claim 3, wherein performing the dispense operation further includes controlling a rate of dots dispensed by the dispensing unit to be a substantially consistent rate along the length of the gap.

5. The method of claim 1, wherein performing the dispense operation includes controlling a rate of dots dispensed by the dispensing unit to dispense a desired number of dots within a respective segment.

6. The method of claim 5, wherein performing the dispense operation further includes controlling a speed of the dispensing unit gantry to be a substantially consistent speed along the length of the gap.

7. The method of claim 1, wherein each image is composed of pixels with each pixel being the smallest picture element the vision system can uniquely identify and interpreted as Black or White with shades of gray.

* * * * *